July 25, 1961 H. M. STRAUBE 2,994,044

DUAL TRANSISTOR SWITCH

Filed Feb. 5, 1957

INVENTOR
H. M. STRAUBE
BY H. O. Wright
ATTORNEY

United States Patent Office
2,994,044
Patented July 25, 1961

2,994,044
DUAL TRANSISTOR SWITCH

Harold M. Straube, Mendham, N.J., assignor to Bell Telephone Laboratories, Incorporated, New York, N.Y., a corporation of New York
Filed Feb. 5, 1957, Ser. No. 638,297
11 Claims. (Cl. 332—47)

This invention relates generally to transistor switches and more particularly to a switch type amplitude modulator.

In general, all modulators are constructed to translate an information signal of a given frequency content from a source to a load impedance as a new signal of like informational significance, that is, a new signal having an entirely different frequency content. Important measures of the efficiency of a modulator are, first, the amount of distortion imposed upon the informational content of the input or modulating signal, and, second, the amount of control power, in modulator terminology, "carrier" signal power, expended in effecting the information energy translation and the signal frequency transposition.

It has been known that a single transistor switch is a most useful device for effecting such a modulation process with a reduced control power. Such a switch, however, has lain open to the objection that in its use undesirable distortion may be introduced to the modulation output signal by leakage of control signal power to the output, or utilization, circuit. As a counter for this defect transistor switches have been serially connected to provide cancellation of such control signal leakage. Such serial connection, however, has resulted in the undesirable imposition of attenuation losses upon the input signal energy in its passage through the serially-connected dual-transistor switch.

It is an object of the present invention, however, to reduce the output signal distortion of a modulating transistor switch and to reduce at the same time attenuation losses imposed upon a modulating signal in its passage through a switch.

These and other objects of the invention are achieved with the employment of two transistors of opposite conductivity types. In accordance with the invention these transistors are connected in parallel insofar as their internal signal conduction paths are concerned and are connected in series insofar as their control circuits are concerned. Thus, the serial control circuit connection of the opposite conductivity-type transistors simultaneously drives the two opposite conductivity-type transistors to alernate states of high and low conduction. Hence, the invention provides low-loss, parallel signal conduction paths while at the same time mutually opposing paths through the serially connected control circuits are provided for distortion signals arising in the opposite conductivity-type transistors.

These and other objectives, features and advantages of the invention will become more readily apparent from a consideration of the appended claims and the following brief description of specific illustrative embodiments of the invention shown in the drawings in which:

Figure 1:
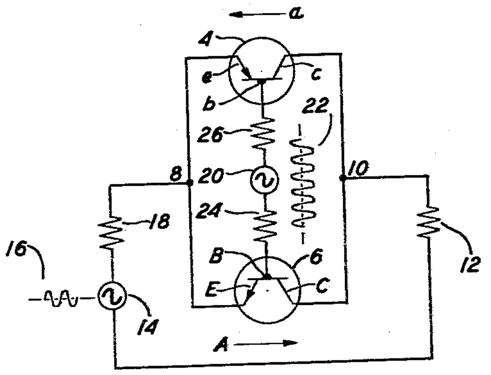
FIG. 1 is a schematic diagram which illustrates a simple, but preferred embodiment of the invention.

In more detail, FIG. 1 shows a first junction transistor 4 of one conductivity type, for example, a p-n-p junction transistor, having an emitter electrode *e*, a collector electrode *c* and a base electrode *b*. A second junction transistor 6, of an opposite conductivity type, for example, an n-p-n junction transistor, having an emitter electrode E, a collector electrode C, and a base electrode B, shares a common emitter connection point 8 and a common collector connection point 10 with the first transistor 4. A two-terminal load impedance or utilization circuit 12, here shown illustratively as a resistor, has one terminal connected to the common collector connection point 10. A two-terminal modulating signal source 14 supplies a modulating signal which may have a waveform as illustrated by the curve 16, through an impedance-matching resistor 18 to the common emitter connection point 8. The modulating signal source is further connected in series with the load impedance 12, thereby to complete a series loop through the common emitter point 8 and the common collector point 10.

A two-terminal carrier signal source 20 generates a switching control signal which may have the waveform illustrated by the curve 22. This signal has a voltage amplitude substantially greater than that of the modulating signal. The carrier signal source is connected by way of balancing resistors 24 and 26 between the base electrodes *b* and B of the paired transistors 4 and 6, respectively, thus to switch the two transistors simultaneously between On and Off conduction conditions. In addition to their selection to perform an obvious balancing function, these resistors are chosen of sufficient resistance value to prevent undesired leakage of the modulating signal to the load as will be discussed in more detail below.

During a time interval when the modulating signal wave 16 is positive, the carrier signal 22, at a given instant, may likewise swing to a positive condition. That is to say, at this instant the first base electrode *b* is positive with respect to the second base electrode B. Considering only the transistor conduction paths from the emitters *e* and E to the collectors *c* and C, respectively, both junctions of the transistor 4 and of the transistor 6 are reversely biased. Accordingly, no current flows in either path. Hence, the modulating signal current is effectively interrupted or switched Off and does not appear as an output signal in the load impedance 12. At a later instant, as the carrier signal 22 swings negatively, both junctions of both transistors are forwardly biased, and the modulating input signal 16 is translated through two low resistance paths, i.e., through the emitter to collector paths *e* to *c* and E to C, to complete or close the series loop including source 14 and the load 12.

Thus, at this later instant, the two transistors, in accordance with the invention, constitute a switch in the On condition.

That is to say that in the On condition of the two transistors, the parallel combination of the forwardly biased resistances of the two transistors closes the circuit between the load 12 and source 14. By way of example, these resistances may be of the order of two ohms each. Since a typical transmission line, represented in the circuit of FIG. 1 by the resistor 12, may have, for example, an impedance of 300 ohms, it is apparent that the parallel combination of the two emitter-to-collector paths introduces negligible loss in transferring the signal from the source 14 to the load 12. So much for the behavior of the modulating signal current indicated by the waveform 16.

A transistor in being switched On and Off, as, in this case, by the signal source 20 is not a perfect switch. It has imperfections that produce effects which, for convenience of analysis, may be considered as those produced by an equivalent battery. When a transistor is conducting, this battery generates a voltage V in a direction as indicated in the figure by the arrows *a* and A, respectively, for the transistor 4 and for the transistor 6. Hence, during the conducting interval these voltages appearing across the parallel transistor paths *e* to *c* and E to C are in directions to provide mutual cancellation and do not appear in the load impedance.

In the Off condition the transistors 4 and 6 act as sources of current having a direction opposite to that indicated by the arrows *a* and A. This current typically may be of the order of one microampere. The low resistance current path provided by the common emitter and common collector connections, in view of the mutually cancelling directions of leakage current flow, effectively isolates this leakage current from the load impedance Thus this distorting current circulates within the nearly zero impedance loop resulting from the common emitter and collector connections. Hence, this current does not circulate through and is effectively short-circuited from the load resistor 12.

Returning now to consideration of the balancing resistors 24 and 26, it appears that currents derived from the modulating signal source 14, like currents derived from the carrier signal source 20, may in some measure control the switching effectiveness of the transistors 4 and 6 between On and Off conditions. Illustratively, if a short circuit connection were made between the two bases *b* and B, normal junction diode conduction would take place through the path from the upper transistor emitter *e* to the base B of the lower transistor, through the collector C of the lower transistor, thence through the common collector connection point 10 to the load impedance 12. Such conduction would obviously constitute a distortion signal in the load impedance.

This hypothesized distortion signal leakage has been verified by experimental observations conducted in evaluating the operability of the invention. Thus, reduction in the combined resistance value of the resistors 24 and 26 in relation to that of the load impedance 12 have led to increases, as much as 30 decibels, in the second and third order intermodulation products appearing in the load. These higher order intermodulation products constitute distortion in the accomplishment of the modulation process.

More specifically, with a load impedance of 300 ohms, a change in the total resistance value of the resistors 24 and 26 from 16 kilohms to 100 kilohms has increased the output signal to noise ratio by approximately 30 decibels. Accordingly, the invention interconnects the switching signal source 20 between the two transistor bases *b* and B through resistors 24 and 26 which have a very large resistance value compared with the impedance of the load 12. Thus, the invention provides a high impedance for the modulating signal between the base electrodes, *b* and B, of the two transistors 4 and 6 respectively.

Figure 2:
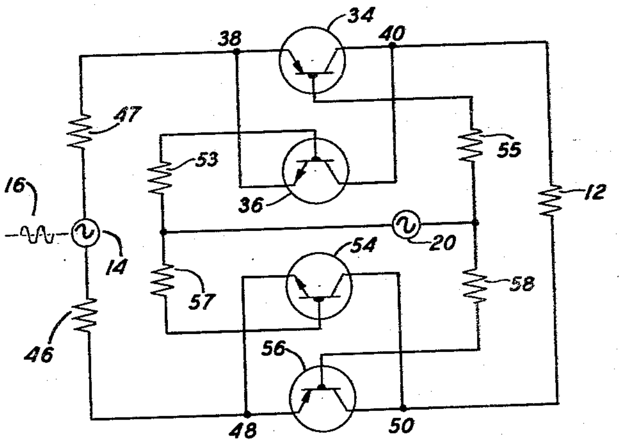
FIG. 2 is a schematic diagram which illustrates a more refined modulator embodying principles of the invention.

Turning next to FIG. 2, there is seen a balanced modulator employing the principles of the invention. A first pair of transistors 34 and 36 of opposite conductivity types are provided with a common emitter connection point 38 and a common collector connection point 40. A similar pair of transistors 54 and 56, of opposite conductivity types, are likewise provided with a common emitter connection point 48 and a common collector connection point 50. The load impedance 12, as described above in connection with FIG. 1, is interconnected between the common collector connection points 40 and 50. A modulating signal source 14, as described in the discussion of FIG. 1, similarly is interconnected through two impedance-matching and balancing resistors 46 and 47 to the common emitter connection points 38 and 48 respectively. A carrier signal source 20, like that of FIG. 1, is interconnected in series through the high impedance, balancing resistors 53 and 55, between the base electrodes of the first pair of transistors 34 and 36. In parallel with this connection between the first transistor pair base electrodes, the base electrodes of the transistors 54 and 56 are also interconnected serially through the high impedance resistors 57 and 58, with the carrier source 20. Recalling the discussion of FIG. 1, it is apparent from the diagram of FIG. 2 that all four transistors 34, 36, 54 and 56 are simultaneously rendered conducting or nonconducting in alternation as the voltage of the control signal source 20 changes polarity.

This embodiment of the invention achieves the well-known advantages of balanced modulators. In addition, as the upper switch, comprising the transistors 34 and 36 is actuated by the signal source 20, any unbalance which might exist in the residual transistor leakage signals of this transistor pair, as discussed in connection with the circuit shown in FIG. 1, may be eliminated by a like unbalance in the residual signals derived from the transistors 54 and 56. Hence, this circuit shown in FIG. 2 not only achieves the advantages to be derived from balanced modulation by any switching arrangement but, in addition, may approach a perfect balance of the internal error signals which affect the operation of the individual switches themselves.

Figure 3:
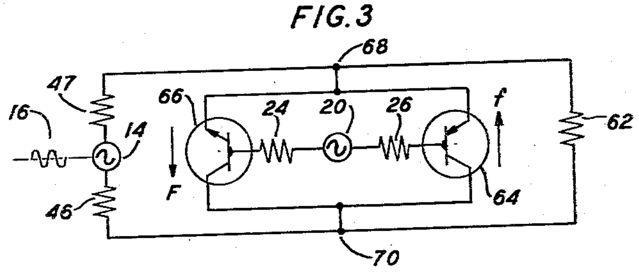
FIG. 3 is also a schematic diagram which illustrates a third embodiment of the invention.

Turning next to FIG. 3, in this figure a modulator is shown which, like the circuit of FIG. 1, employs two opposite conductivity-type transistors 64 and 66 having a common emitter connection point 68 and a common collector connection point 70. A load impedance element 62 is connected between these two common points 68 and 70 as shown. A modulating signal source 14, as described in connection with FIG. 1, also is interconnected through impedance-matching and balancing resistors 46 and 47, respectively, between the common emitter point 68 and the common collector point 70. Thus, a parallel combination of a dual-transistor switch and a load impedance is presented to the modulating signal source 14 at the connection point 68 and 70.

The earlier described control, or carrier, signal source 20 is connected through the two high impedance balancing resistors 24 and 26 to the base electrodes of the two switch transistors.

The employment of the modulator switch in the circuit of FIG. 3, while related to that of the circuit shown in FIG. 1, is in a sense inverse to that of the former circuit. That is to say, as the control signal drives the transistors 64 and 66 into a conducting state, the load impedance 62 is isolated from the modulating signal source 14 by the nearly zero impedance of the transistors shunted across the connection points 68 and 70. In the Off condition the transistors present an effectively infinite impedance across the terminals 68 and 70 and, to a high degree of accuracy, the signal derived from the source 14 appears directly across the load impedance 62.

During an interval of time such as considered in the discussion of FIG. 1, that is, an interval in which an input modulation signal is positive from the common connection point 68 to the common connection point 70, and in more detail, considering an instant when the signal derived from the source 20 is of such polarity as to drive the two transistors 64 and 66 to the fully On condition, the load impedance 62 is effectively isolated from the modulating signal by the short circuiting low impedance of the two conducting transistors. In this condition the transistors 64 and 66 may be represented as voltage sources having opposed polarities as indicated by the arrows *f* and F. Hence, during the interval when the modulating signal is isolated from the load impedance by the conducting transistors, the internally generated transistor voltages are effectively cancelled within the switch circuitry and do not leak to the load impedance.

Similarly, in the Off transistor condition the transistors may be represented as sources of leakage currents in directions reverse to that shown by the arrows *f* and F. Again, as in the consideration of FIG. 1, cancellation of the two transistor leakage currents takes place by virtue of the common conduction electrode connections in accordance with the invention.

The employment of the dual-transistor modulating switch in the circuit of FIG. 3 is related to that of FIG.

1. For some purposes, it may be that either circuit is equally suited to perform a desired modulation function. In general, if the load impedance be large, say two kilohms, normal transistor switches will yield an improved signal-to-noise ratio when connected in parallel rather than in series with the load. Insofar as any specific embodiment of the invention falls short of theoretical perfection, this same generalization may be made with regard to the embodiments of the invention shown in FIGS. 1 and 3. Hence, as the load impedance 12 is two kilohms or more, the employment of the circuit shown in FIG. 3 may be preferable to that of FIG. 1.

The embodiments above described, it is to be understood, are illustrative and in no sense exhaustively encompass all structural applications of the principles of the invention. It is well known to those skilled in the art, for example, that many transistors are symmetrical and that in these no distinction lies between the emitter and the collector electrode. Hence, though the three illustrative preferred embodiments have been discussed in terms of asymmetrical transistors, the invention fully comprehends the employment of symmetrical transistors as well. Similarly, the invention comprehends the employment of semiconductor elements other than the junction transistors shown in the figures. These other semiconductor elements may include, for example, paired opposite conductivity-type point contact transistors.

What is claimed is:

1. In combination with a source of carrier signals to be modulated and a source of modulating signals, a modulator which comprises a pair of transistor switches of opposite conductivity types, each of said transistor switches having an emitter electrode, a collector electrode and a base electrode, said emitter electrodes being connected in common and said collector electrodes being connected in common, circuit means for direct-current coupling said modulating source in series with said common emitter electrodes and said common collector electrodes, a load impedance, a circuit means for direct-current coupling said load impedance in series with said common electrodes and circuit means for direct-current coupling said carrier signal source between said base electrodes.

2. Apparatus as set forth in claim 1 wherein said carrier signal direct-current coupling means includes elements having large impedance values compared to the value of said load impedance.

3. A signal controlled impedance element comprising a first transistor switch of a given conductivity type, a second transistor switch of an opposite conductivity type, each of said transistor switches comprising an emitter electrode, a collector electrode, and a base electrode, a first terminal connected in common to said emitter electrode, a second terminal connected in common to said collector electrodes, a control signal source having a first terminal and a second terminal, balanced impedance means for direct-current coupling said first signal source terminal with the base electrode of said first transistor switch and for direct-current coupling said second signal source terminal with said base electrode of said second transistor switch whereby signals from said source control the impedance between said first and second terminals.

4. In combination with a two-terminal source of carrier signals to be modulated and a two-terminal source of modulating signals, a first transistor switch of a given conductivity type, a second transistor switch of an opposite conductivity type, each of said transistor switches having an emitter electrode, a collector electrode and a base electrode, a two-terminal load impedance, an input point direct-current coupled in common to said emitter electrodes and to one of said modulating signal source terminals, an output point direct-current coupled in common to said collector electrodes and to one of said load impedance terminals, circuit means for direct-current coupling the remaining one of said load impedance terminals with the remaining one of said modulating signal source terminals and circuit means for direct-current coupling said carrier signal source terminals with said base electrodes, respectively.

5. In combination with a two-terminal source of carrier signals to be modulated, a two-terminal load impedance, and a two-terminal source of modulating signals, a first transistor switch of a given conductivity type, a second transistor switch of an opposite conductivity type, each of said transistor switches having an emitter electrode, a collector electrode and a base electrode, means for direct-current coupling one of said modulating source terminals, one of said load impedance terminals, and said emitter electrodes in common, means for direct-current coupling the other of said modulating source terminals, the other of said load impedance terminals, and said collector electrodes in common, and circuit means for direct-current coupling said carrier signal source between said base electrodes.

6. Apparatus as set forth in claim 5 wherein said carrier signal source direct-current coupling means comprises a first resistor connecting one of said base electrodes with one of said carrier signal source terminals and a second like resistor connecting the other of said base electrodes with the other of said carrier signal source terminals, said resistors having an impedance which is large compared to said load impedance.

7. In combination with a source of carrier signals to be modulated, a load impedance and a source of modulating signals, a modulating switch comprising a first transistor switch of a given conductivity type, a second transistor switch of an opposite conductivity type, each of said transistor switches having an emitter electrode, a collector electrode and a base electrode, balanced impedance means for direct-current coupling said carrier signal source between the base electrodes of said transistor switches, whereby said transistor switches are simultaneously brought to like conditions of conduction, an input point connected in common to said emitter electrodes, and an output point connected in common to said collector electrodes, circuit means for direct-current coupling said switch input point, said switch output point and said modulating signal source in series, and means for direct-current coupling said load impedance in circuit with said modulating switch.

8. In combination with a source of carrier signals to be modulated and a source of modulating signals, a modulator which comprises a pair of transistor switches of opposite conductivity types, each of said transistor switches having an emitter electrode, a collector electrode and a base electrode, said emitter electrodes being connected to a common emitter terminal and said collector electrodes being connected to a common collector terminal, a load impedance, circuit means for direct-current coupling said modulating source in series with said load impedance and between said common emitter and common collector terminals, and means for direct-current coupling said carrier signal source between said base electrodes.

9. In combination with a source of carrier signals to be modulated and a source of modulating signals, a modulator which comprises a pair of transistor switches of opposite conductivity types, each of said transistor switches having an emitter electrode, a collector electrode and a base electrode, said emitter electrodes being connected to a common emitter terminal and said collector electrodes being connected to a common collector terminal, a load impedance, circuit means for direct-current coupling said modulating source and said load impedance between said common emitter and said common collector terminals, and means for direct-current coupling said carrier signal source between said base electrodes.

10. In combination, a two-terminal source of carrier signals to be modulated, a two-terminal source of modulating signals, a pair of transistors of opposite conductivity types, each of the transistors of said pair having an emitter electrode, a collector electrode and a base electrode, said emitter electrodes being connected in common and said collector electrodes being connected in common, the collector and emitter electrodes of each of said transistors being interconnected with the emitter and collector electrodes of the other of said transistors through the base electrodes of said transistors solely by said source of carrier signals, circuit means for connecting said modulating source in series with said common emitter electrodes and said common collector electrodes, and circuit means for connecting a load impedance in series with said common emitter and common collector electrodes.

11. In combination, a two-terminal source of carrier signals to be modulated, a two-terminal source of modulating signals, a pair of transistors of opposite conductivity types, each of the transistors of said pair having an emitter electrode, a collector electrode and a base electrode, said emitter electrodes being connected in common and said collector electrodes being connected in common, said two-terminal source of carrier signals being connected for electrically isolating said base electrodes one from another, circuit means for connecting said modulating source in series with said common emitter electrodes and said common collector electrodes, and circuit means for connecting a load impedance in series with said common emitter and common collector electrodes.

References Cited in the file of this patent

UNITED STATES PATENTS

| | | |
|---|---|---|
| 2,780,725 | Johanson | Feb. 5, 1957 |
| 2,780,782 | Bright | Feb. 5, 1957 |
| 2,890,418 | Zawels | June 9, 1959 |

FOREIGN PATENTS

| | | |
|---|---|---|
| 203,165 | Australia | Dec. 8, 1955 |
| 1,125,813 | France | Nov. 8, 1956 |

OTHER REFERENCES

Transistor Electronics by Lo, Endres, Zawels, Waldhauer, and Cheng, Prentice-Hall Engineering Series, published Sept. 26, 1955, pp. 396 to 400.